US007268332B2

(12) United States Patent
Yamazaki

(10) Patent No.: US 7,268,332 B2
(45) Date of Patent: Sep. 11, 2007

(54) DISPLAY DEVICE AND DRIVING METHOD OF THE SAME

(75) Inventor: Shunpei Yamazaki, Setagaya (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 228 days.

(21) Appl. No.: 11/034,707

(22) Filed: Jan. 14, 2005

(65) Prior Publication Data

US 2005/0162355 A1 Jul. 28, 2005

(30) Foreign Application Priority Data

Jan. 26, 2004 (JP) ............................ 2004-017569

(51) Int. Cl.
*H01L 27/00* (2006.01)

(52) U.S. Cl. ................................ 250/208.1; 250/214 R

(58) Field of Classification Search ............ 250/208.1, 250/214 R
See application file for complete search history.

(56) References Cited

U.S. PATENT DOCUMENTS 7,006,062 B2 * 2/2006 Li .............................. 345/82

FOREIGN PATENT DOCUMENTS

WO WO 01/006484 1/2001

* cited by examiner

*Primary Examiner*—Que T. Le
(74) *Attorney, Agent, or Firm*—Eric J. Robinson; Robinson Intellectual Property Law Office, P.C.

(57) ABSTRACT

The invention provides a display device, a driving method thereof, and an element substrate that a high image quality can be realized and a deterioration of a light emitting element can be improved. The invention includes a plurality of pixels arranged in matrix. Each of the plurality of pixels includes a light emitting element, a transistor, and an alternate current driving bypass element. The light emitting element and the transistor are connected in series and the alternate current driving bypass element and the transistor are connected in parallel.

10 Claims, 9 Drawing Sheets

FIG.3A PROGRAMMING PERIOD
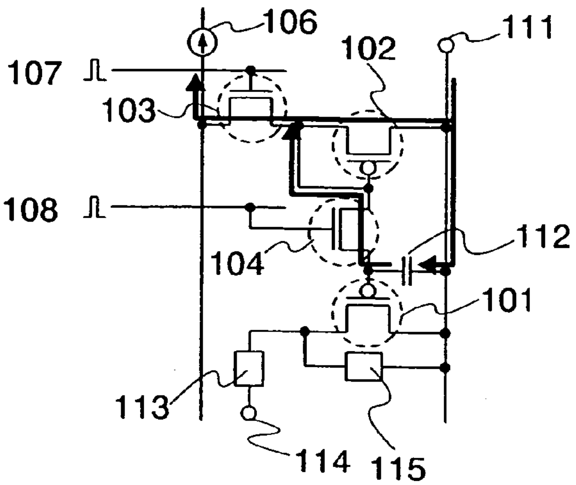
FIG.3B LIGHT EMISSION PERIOD
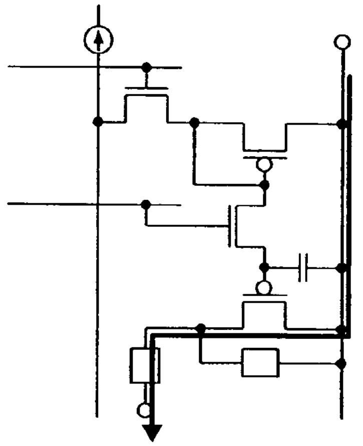
FIG.3C REVERSE BIAS VOLTAGE APPLYING PERIOD
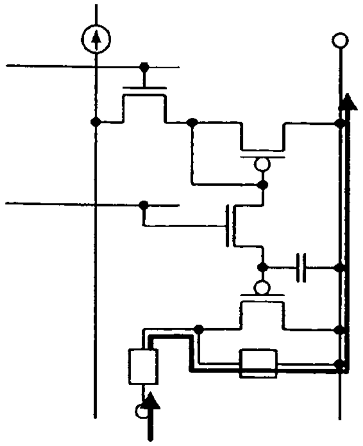

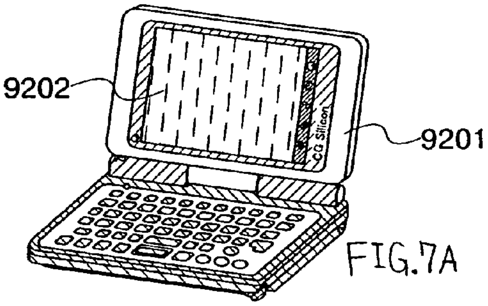
FIG.7A
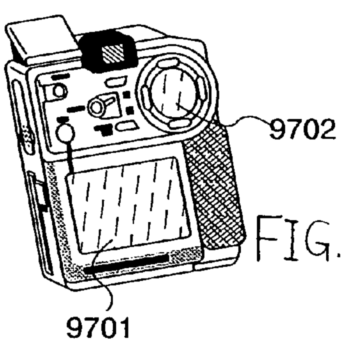
FIG.7B
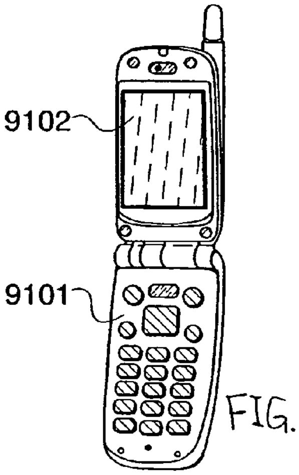
FIG.7C
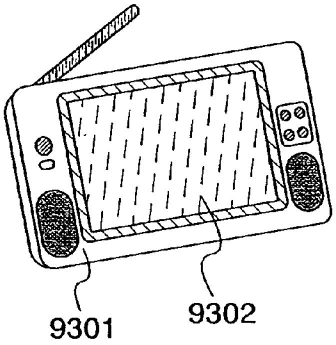
FIG.7D
FIG.7E
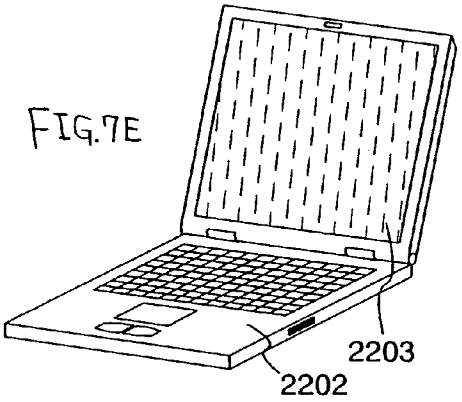
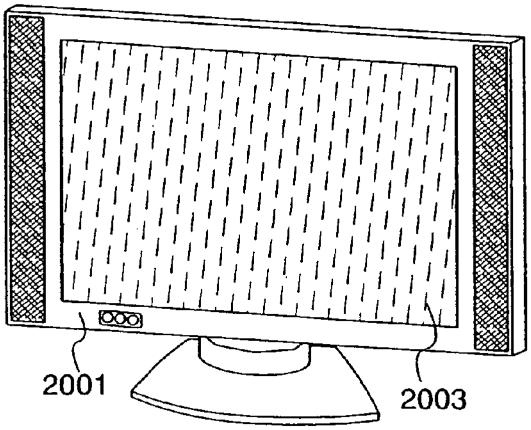
FIG.7F

DISPLAY DEVICE AND DRIVING METHOD OF THE SAME

BACKGROUND OF THE INVENTION

1. Field of the Invention

The present invention relates to a display device having a self-light emitting element and to a driving method thereof. The invention also relates to an element substrate having an element on an insulating surface.

2. Description of the Related Art

In recent years, research and development of a display device having a self-light emitting element represented by an EL (Electro Luminescence) element is advanced, which is expected to be widely used by virtue of high image quality, wide viewing angle, and thin design, lightweight and the like without requiring a backlight. In general, a current value supplied to the EL element and luminance of the EL element are in proportion. Therefore, a pixel configuration which is different from an LCD of which luminance is controlled by a voltage value is suggested. For example, a pixel configuration that luminance is controlled by a current value is suggested (see Patent Document 1).

Patent Document 1

PCT International Publication for Patent Application No. WO 01/06484 pamphlet.

SUMMARY OF THE INVENTION

As an example of a defect of a light emitting element, there is a defect that a short-circuit occurs between both electrodes of the light emitting element. This defect occurs when the both electrodes of the light emitting element contact each other without interposing an electroluminescent layer due to a defect in deposition of the electroluminescent layer caused by a dust, a projection and the like on a pixel electrode when forming the light emitting element. In the case where a short-circuit occurs between both electrodes of a light emitting element, a current flows to the entire surface of the light emitting element to emit light with a forward bias voltage being applied. However, in the short-circuit portion, a current flows through the both electrodes. The current flowing through the short-circuited portion does not contribute to light emission.

As a defect of a light emitting element, there is another defect that the thickness of an electroluminescent layer becomes thin due to a dust in a deposition step of the light emitting element and the like. In this case, the light emitting element emits light in initial stages, however, as a portion having thin film thickness has more stress than a periphery portion, a similar defect to the aforementioned short-circuited portion is likely to occur. This defect is a progressive defect that comes up with an actual driving time, therefore, initial aging treatment may not be able to manage this in some cases.

In view of the aforementioned problems, the invention provides a display device, a driving method thereof, and an element substrate that a high image quality can be realized and a deterioration of a light emitting element can be improved.

In order to solve the aforementioned problems of a conventional technique, the invention employs a method to apply a reverse bias voltage to a light emitting element as one measure for improving reliability of the light emitting element. By applying a reverse bias voltage to a light emitting element, the light emitting element has a rectifying property as an electronic characteristic like a diode. Therefore, a current flows to a short-circuit portion although a reverse current does not flow. By flowing a current in a concentrated manner, the short-circuit portion can be burned out to be repaired.

The display device of the invention includes a plurality of pixels arranged in matrix. The plurality of pixels each has a light emitting element, a transistor, and an alternate current driving bypass element. The light emitting element and the transistor are connected in series while the alternate current driving bypass element and the transistor are connected in parallel.

The aforementioned display device has a current source. The transistor outputs a current to the light emitting element depending on the magnitude of a signal current supplied from the current source.

The display device of the invention includes a plurality of pixels arranged in matrix. The plurality of pixels each has a light emitting element, a first transistor, a second transistor, a third transistor, a fourth transistor, a capacitor, and an alternate current driving bypass element.

A gate terminal of the third transistor is connected to a third wiring, one of a source and a drain terminals of the third transistor is connected to a first wiring while the other is connected to a gate terminal of the second transistor, one of a source and a drain terminals of the second transistor is connected to a second wiring while the other is connected to a gate terminal of the second transistor, a gate terminal of the fourth transistor is connected to a fourth wiring, one of a source and a drain terminals of the fourth transistor is connected to the gate terminal of the second transistor while the other is connected to a gate terminal of the first transistor, one of a source and a drain terminals of the first transistor is connected to the second wiring while the other is connected to a first electrode of a light emitting element, a second electrode of the light emitting element is connected to a counter power source, one of terminals of the capacitor is connected to the second wiring while the other is connected to the gate terminal of the first transistor, and one of terminals of the alternate current driving bypass element is connected to the second wiring while the other is connected to the first electrode of the light emitting element.

Further, the gate terminal of the third transistor is connected to the third wiring, one of the source and the drain terminals of the third transistor is connected to the first wiring while the other is connected to one of the source and the drain terminals of the second transistor, the other of the source and the drain terminals of the second transistor is connected to the second wiring, the gate terminals of the fourth transistor is connected to the fourth wiring, one of the source and the drain terminals of the fourth transistor is connected to a connection of one of the source and the drain terminals of the second transistor and one of the source and the drain terminals of the third transistor, while the other of the source and the drain terminal of the fourth transistor is connected to a connection of the gate terminal of the first transistor and the gate terminal of the second transistor, one of the source and the drain terminals of the first transistor is connected to the second wiring while the other is connected to the first electrode of the light emitting element, the second electrode of the light emitting element is connected to a counter power source, one of the terminals of the capacitor is connected to the second wiring while the other is connected to the gate terminal of the first transistor, and one of the terminals of the alternate current driving bypass element is connected to the second wiring while the other is connected to the first electrode of the light emitting element.

The alternate current driving bypass element is a transistor that a diode, a gate terminal and a drain terminal are connected.

The light emitting element has a first electrode and a second electrode, one of which transmits light while the other of which reflects light. Alternatively, the first electrode and the second electrode of the light emitting element transmit light.

In a display device having the aforementioned structure of the invention, an element substrate that up to a pixel electrode of a light emitting element is formed is provided. More specifically, the element substrate has a transistor and a pixel electrode connected to the transistor on an insulating surface and does not have an electroluminescent layer and a counter electrode.

According to the invention having the aforementioned structure, a display device that an effect due to variations in characteristics of transistors, in particular driving TFTs is suppressed and a high image quality is realized can be provided. Further, a display device that a deterioration of a light emitting element is improved and high reliability is realized can be provided.

BRIEF DESCRIPTION OF THE DRAWINGS

FIGS. 3A to 3C are diagrams showing embodiment mode of the invention.

FIGS. 7A to 7F are diagrams showing Embodiment Mode 3 of the invention.

DETAILED DESCRIPTION OF THE INVENTION

Embodiment Mode

Figure 1:
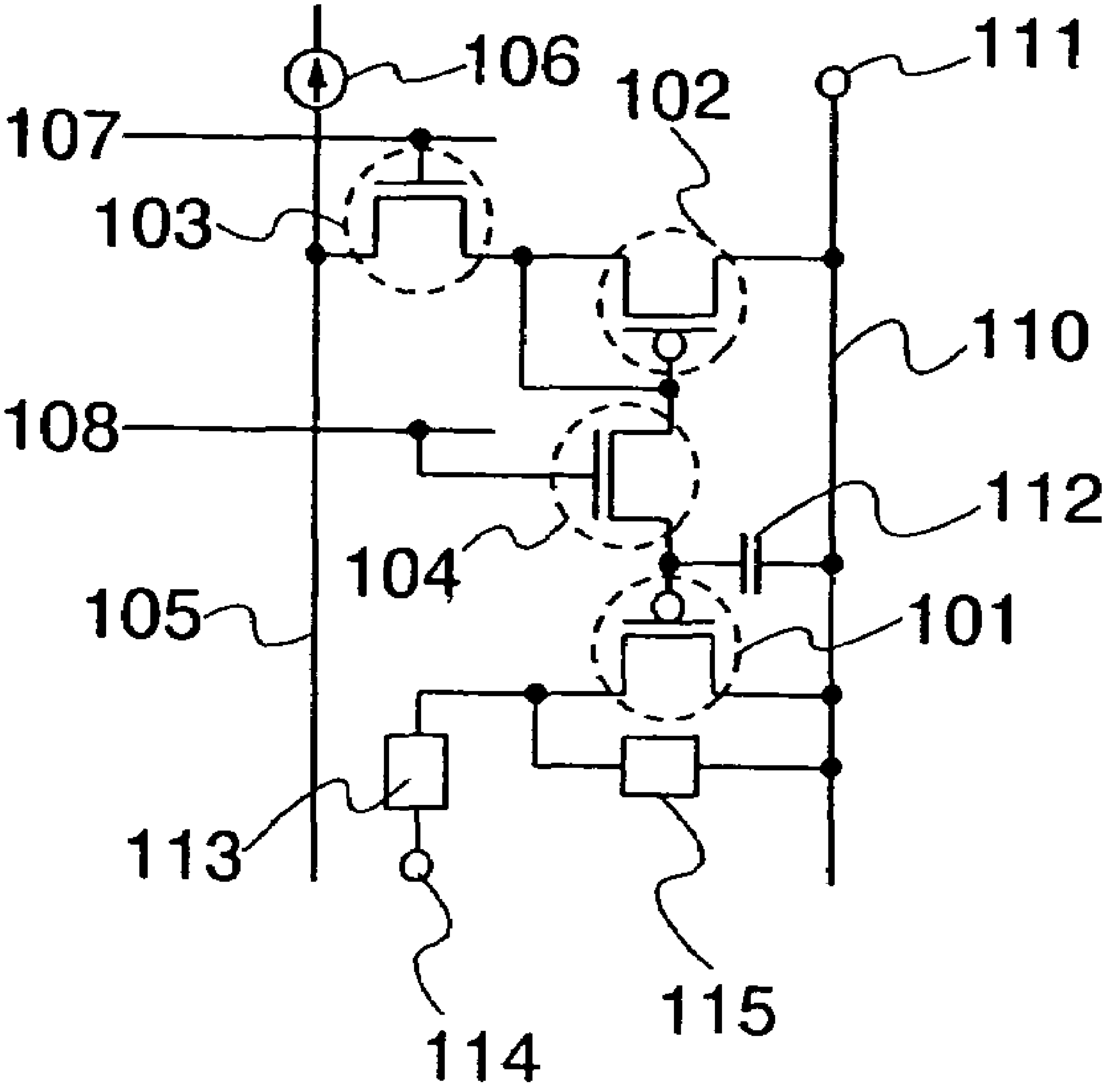
FIG. 1 is a diagram showing embodiment mode of the invention.

Although the present invention will be fully described by way of example with reference to the accompanying drawings, it is to be understood that various changes and modifications will be apparent to those skilled in the art. Therefore, unless such changes and modifications depart from the scope of the present invention hereinafter defined, they should be construed as being included therein. Note that identical portions in embodiment modes are denoted by the same reference numerals and detailed descriptions thereof are omitted.

Figure 4:
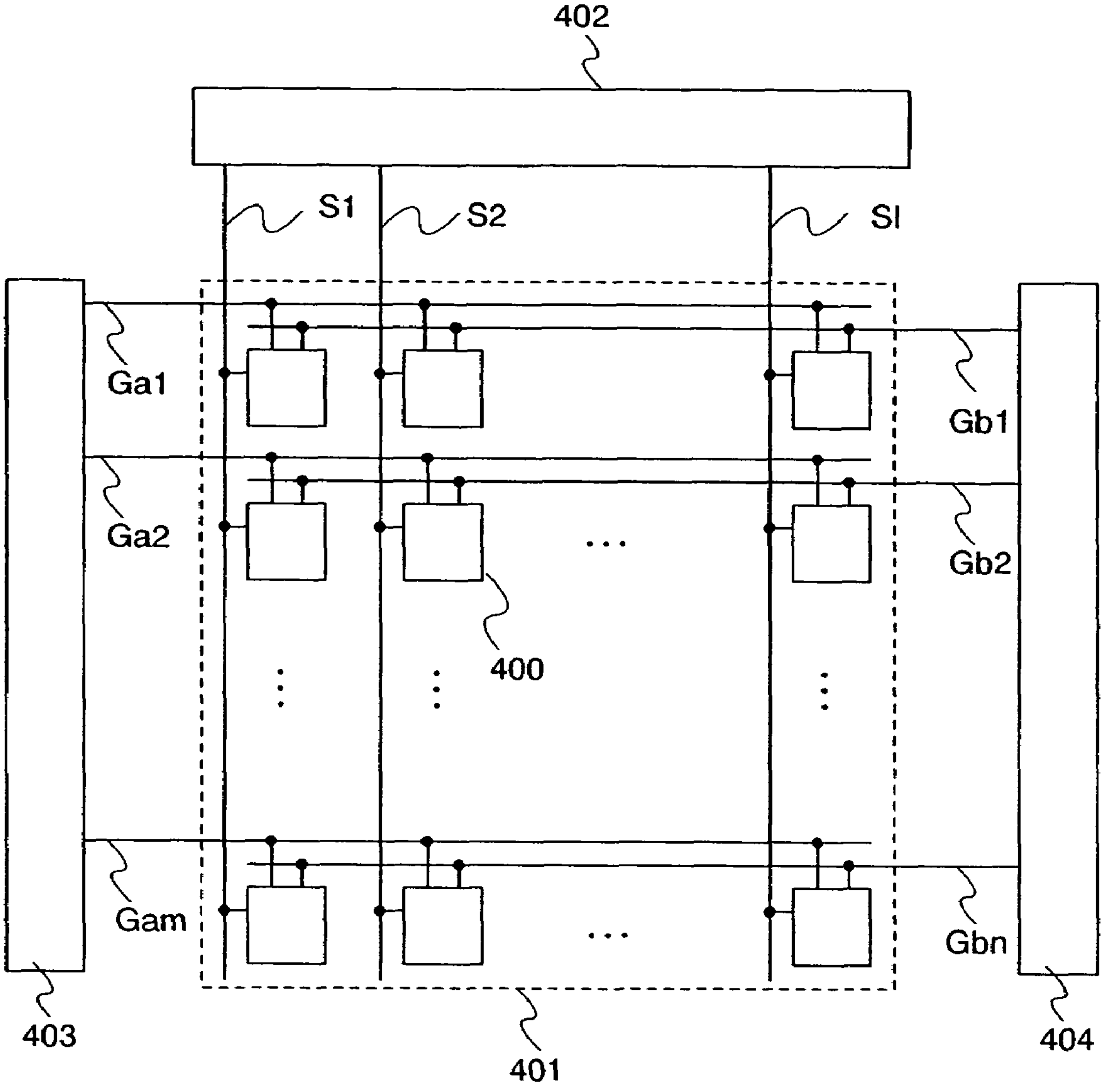
FIG. 4 is a diagram showing a structure of the display device of the invention.

A structure of the display device of the invention is described. The display device of the invention includes a display region 401 in which a plurality of source lines S1 to Sl (l is a natural number) to which a signal from a source driver circuit 402 are outputted, first gate lines Ga1 to Gam (m is a natural number) to which a signal from a first gate driver circuit 403 is outputted, and second gate lines Gb1 to Gbn (n is a natural number) to which a signal from a second driver circuit 404 is outputted are arranged in matrix (see FIG. 4). Further, the display region 401 includes a plurality of pixels 400 including a plurality of elements in a region where a source line Sx (x is a natural number, 1×l), a first gate line Gy (y is a natural number, 1 y m), and a second gate line Gz (z is a natural number, 1 z n) cross interposing an insulator.

The pixel 400 includes a light emitting element 113, a switching TFT 103, a holding TFT 104, a driving TFT 101, a converting TFT 102, an alternate current driving bypass element 115 and a capacitor 112 (see FIG. 1).

A gate electrode of the switching TFT 103 is connected to a first gate line 107, one of a source electrode and a drain electrode is connected to a source line 105 while the other is connected to a gate electrode of the converting TFT 102. Further, one of the source electrode and the drain electrode of the converting TFT 102 is connected to a power source line 110 while the other is connected to a gate electrode of the converting TFT 102. A gate electrode of the holding TFT 104 is connected to a second gate line 108, one of a source electrode and a drain electrode is connected to the gate electrode of the converting TFT 102 while the other is connected to a gate electrode of the driving TFT 101. One of a source electrode and a drain electrode of the driving TFT 101 is connected to the power source line 110 while the other is connected to a first electrode of the light emitting element 113. Further, a second electrode of the light emitting element 113 is connected to a second power source 114. A capacitor 112 is connected between the gate electrode of the driving TFT 101 and the power source line 110 while the alternate current driving bypass element 115 is connected between the first electrode of the light emitting element 113 and the power source line 110. A source line 105 is connected to a current source 106 which is controlled according to luminance data while the power source line 110 is connected to a first power source 111.

The conductivity of the switching TFT 103 and the holding TFT 104 are not restricted and they may be either N-type or P-type. Moreover, although the conductivity of the driving TFT 101 and the converting TFT 102 are not restricted either, they are required to have the same conductivity. As for the polarity of the light emitting element 113, provided that a direction of current flow from the first electrode to the second electrode is a forward direction, it is preferable that the driving TFT 101 and the converting TFT 102 are P-type transistors as shown in FIG. 1. Further, provided that a direction of current flow from the second electrode to the first electrode is a forward direction, it is preferable that the driving TFT 101 and the converting TFT 102 are N-type transistors.

Figure 2A:
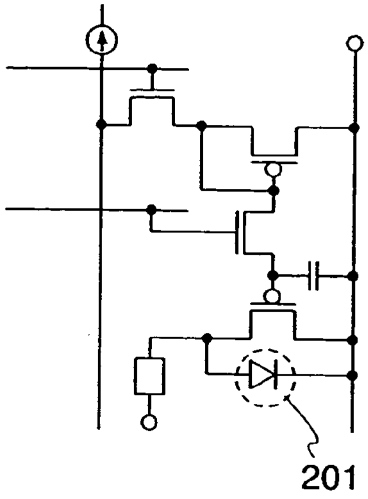
FIGS. 2A to 2C are diagrams showing embodiment mode of the invention.
Figure 2B:
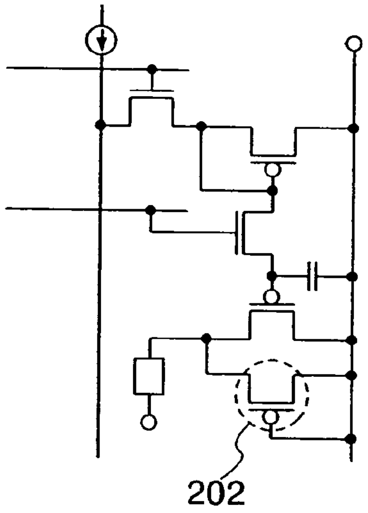
Figure 2C:
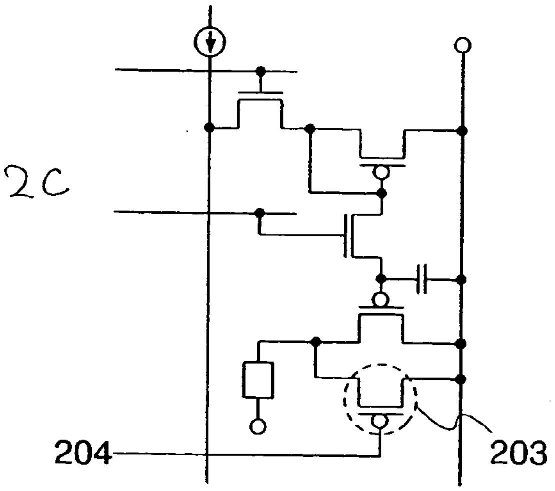

The alternate current driving bypass element 115 is turned OFF when a forward bias voltage is applied to the light emitting element 113 and is turned ON when a reverse bias voltage is applied to the light emitting element 113. For example, as shown in FIG. 2A, the alternate current driving bypass element 115 may be formed of a diode 201 which may have any structure. As shown in FIG. 2B, a transistor 202 which is diode-connected (a gate terminal and a drain terminal thereof are connected) may be used or a PN junction diode, a PIN junction diode and the like may be used as well. Further, as shown in FIG. 2C, a TFT 203 may be used. A gate terminal of the TFT 203 may be controlled from outside the pixels 400 by a control line 204 so as to be turned ON only when a reverse bias voltage is applied to the light emitting element 113.

An operation of the pixel 400 shown in FIG. 1 is described. The operation of the pixel 400 can be divided into a programming period, a light emission period, and a reverse bias voltage applying period (see FIG. 3). First, in the programming period shown in FIG. 3A, an H-level signal is inputted to the first gate line 107 and a second gate line 108, thereby the switching TFT 103 and the holding TFT 104 are turned ON. By connecting the current source 106 and the converting TFT 102, a signal current Idata corresponding to luminance data flows between the source and the drain electrodes of the converting TFT 102. At this time, as the gate electrode and the drain electrode of the converting TFT 102 are connected, the converting TFT 102 operates in a saturation region and a gate-source voltage required to flow the signal current Idata between the source and the drain electrodes of the converting TFT 102 is stored in the capacitor 112. After that, an L-level signal is inputted to the first gate line 107 and the second gate line 108, thereby the switching TFT 103 and the holding TFT 104 are turned OFF. Thus, the programming period is terminated and proceeds to the light emission period. At this time, it is preferable to output an L-level signal to the second gate line 108 prior to the first gate line 107 so that the holding TFT 104 is turned OFF prior to the switching TFT 103.

In the light emission period shown in FIG. 3B, a current Idriv is supplied from the driving TFT 101 to the light emitting element 113 according to a potential difference stored in the capacitor 112 in the programming period. The second power source 114 is required to be controlled so that the driving TFT 101 operates in a saturation region. At this time, the current value Idriv supplied to the light emitting element 113 is determined by the signal current Idata and a ratio of a channel width and a channel length of the driving TFT 101 and the converting TFT 102 when mobility and threshold values of the driving TFT 101 and the converting TFT 102 are identical. Provided that the channel length and the channel width of the driving TFT 101 are L1 and W2 respectively while those of the converting TFT 102 are L2 and W2 respectively, the current value Idriv supplied to the light emitting element 113 is expressed by a formula (1).

$$\text{Idriv}=(W1/L1)/(W2/L2)\cdot\text{Idata} \quad (1)$$

In this manner, in the case where characteristics of TFTs vary among the pixels 400 in the display region 401 but there are no variations in mobility and threshold values of adjacent TFTs (the driving TFT 101 and the converting TFT 102), a current supplied to a light emitting element of the each pixel 400 is dependent on only the signal current Idata which is supplied from the current source 106, therefore, a high quality display without variations in luminance can be performed.

In the reverse bias voltage applying period shown in FIG. 3C, a relationship between potentials of the first power source 111 and the second power source 114 is set opposite to the programming period and the light emission period. In the programming period and the light emission period, the potential of the first power source 111 is higher than that of the second power source 114 and a forward bias voltage is applied to the light emitting element 113 so that a current does not flow to the alternate current driving bypass element 115. On the other hand, in the reverse bias voltage applying period, the potential of the second power source 114 is higher than that of the first power source 111. By turning ON the alternate current driving bypass element 115, a reverse bias voltage is applied to the light emitting element 113. In general, a current does not flow to the light emitting element 113 when a reverse bias voltage is applied. However, because the current is concentrated to the short-circuit portion in the cases where there is a short-circuit portion in the light emitting element 113, the short-circuit portion can be burned out to reduce the deterioration and improve the reliability of the light emitting element 113. According to the invention, not only an initial short-circuit portion but a progressive short-circuit portion can be burned out as well to reduce the deterioration and improve the reliability of the light emitting element 113.

Figure 9:
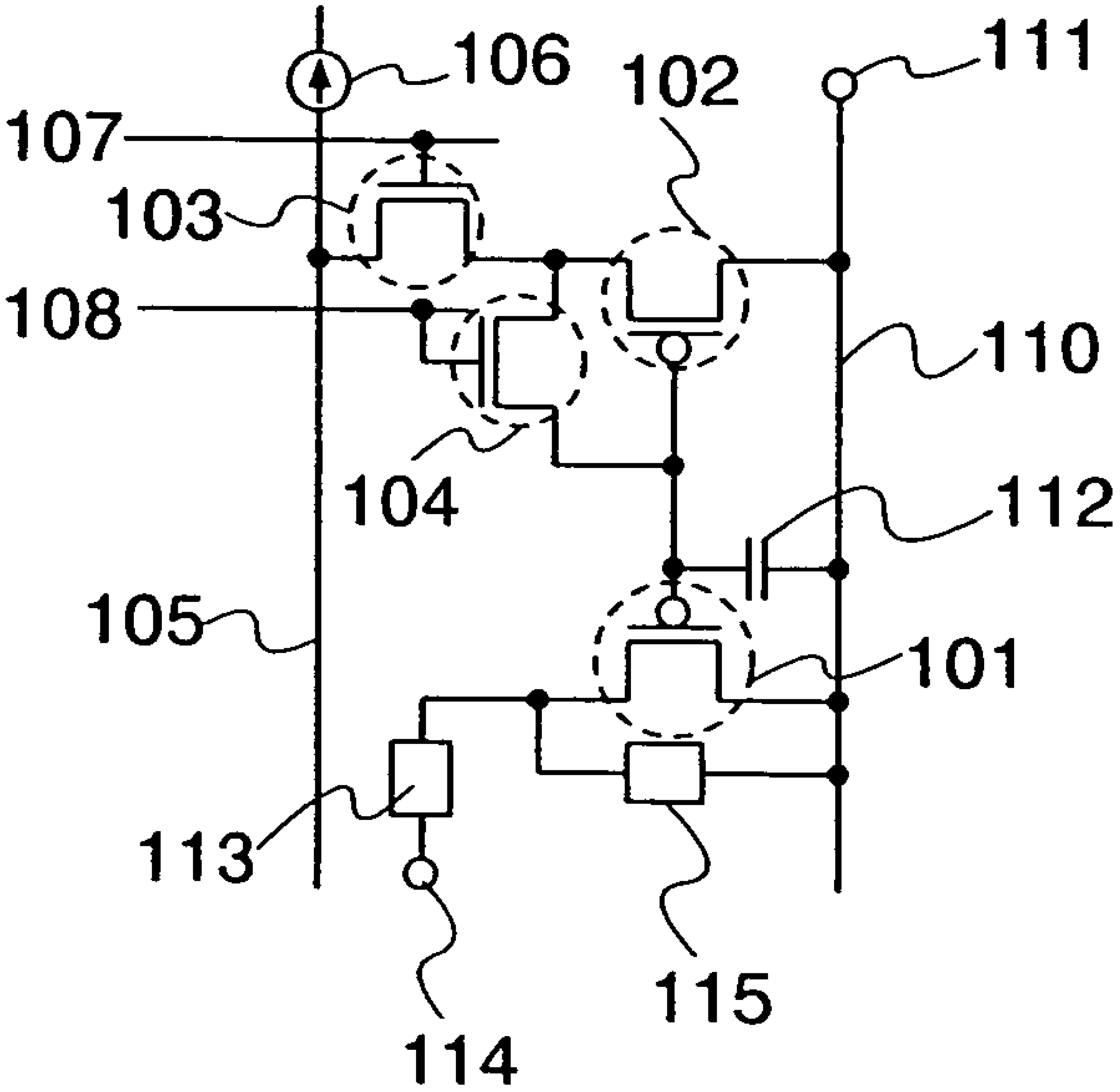
FIG. 9 is a diagram showing embodiment mode of the invention.

The circuit configuration shown in FIG. 1 is described as a representative in this embodiment mode, however, the invention is not limited to this. For example, the holding TFT 104 may be disposed at a different position as shown in FIG. 9.

In the invention having the aforementioned structure, by providing the alternate current driving bypass element 115 connected in parallel to the driving TFT 101 which supplies a current to the light emitting element 113, a reverse bias voltage is applied to the light emitting element 113 in the reverse bias voltage applying period other than the light emission period. Then, a current can easily flow to the short-circuit portion if any in the light emitting element, thereby the short-circuit portion can be easily burned out. According to the invention, a display device which performs a high image quality display and has high reliability regardless of variations of TFT can be provided.

Embodiment 1

A structure of a light emitting element which is a component of the invention is described. The light emitting element corresponds to a lamination of a conductive layer, an electroluminescent layer, and a conductive layer provided on one surface of a substrate having an insulating surface such as glass, quartz, metal, organic substance and the like. The light emitting element may have any one of a lamination type of which electroluminescent layer is formed of a plurality of layers, a single layer type of which electroluminescent layer is formed of a single layer, and a hybrid type of which electroluminescent layer is formed of a plurality of layers but the boundary of them is not distinct. For the lamination structure of the light emitting element, there is a forward lamination structure that a conductive layer corresponding to an anode\an electroluminescent layer\a conductive layer corresponding to a cathode are laminated in this order from the bottom, and a reverse lamination structure that a conductive layer corresponding to a cathode\an electroluminescent layer\a conductive layer corresponding to an anode are laminated in this order from the bottom. An appropriate structure is selected according to a direction of light emission.

The electroluminescent layer is formed of a charge injection/transporting substance containing an organic compound or an inorganic compound and an electroluminescent material, includes one or a plurality of types of layers selected from a low molecular weight organic compound, a medium molecular weight organic compound (an organic compound which does not have a sublimation property and has the number of molecules is 20 or less, or the length of a chain of its molecular is 10 μm or less), and a high molecular weight organic compound, and may be combined with an inorganic compound having an electron injection/transporting property or a hole injection/transporting property.

Among the charge injection/transporting substances, substances which have particularly high electron transporting property are, for example, a metal complex having a quinoline or benzoquinoline backbone such as tris (8-quinolinolato) aluminum (abbr. $Alq_3$), tris (5-methyl-8-quinolinolato) aluminum (abbr. $Almq_3$), bis (10-hydroxybenzo[h]quinolinato) beryllium (abbr. $BeBq_2$), bis (2-methyl-8-quinolinolate)-(-4-phenyl phenolato) aluminum (abbr. BAlq) and the like. Further, substances which have high hole transporting property are, for example, an aromatic amine compound (that is, containing a bond of benzene ring - nitrogen) such as 4,4'-bis[N-(1-naphthyl)-N-phenyl-amino]-biphenyl (abbr. á-NPD), 4,4'-bis [N-(3-methylphenyl)-N-phenyl-amino]-biphenyl (abbr. TPD), 4,4',4"-tris (N,N-diphenyl-amino)-triphenylamine (abbr. TDATA), and 4,4',4"-tris [N-(3-methylphenyl)-N-phenyl-amino]-triphenylamine (abbr. MTDATA).

Moreover, substances which have particularly high electron injection property among the charge injection/transporting substances are, for example, a compound of an alkali metal or an alkali earth metal such as lithium fluoride (LiF), cesium fluoride (CsF), and calcium fluoride ($CaF_2$). Other than these, mixture of a substance which has a high electron transporting property such as $Alq_3$ and an alkali earth metal such as magnesium (Mg) may be used.

For the low molecular weight organic electroluminescent material, 4-(Dicyanomethylene)-2-methyl-6-(1,1,7,7-tetramethyljulolidyl-9-enyl)-4H-pyran (abbr. DCJT), 4-(Dicyanomethylene)-2-t-butyl-6-(1,1,7,7-tetramethyljulolidyl-9-enyl)-4H-pyran (abbr. DPA), periflanthene, 2,5-dicyano-1,4-bis(10-methoxy-1,1,7,7-tetramethyljulolidyl-9-enyl) benzene, N, N'-dimethylquinacridone (abbr. DMQd), coumarin 6, coumarin 545T, tris (8-quinolinolato) aluminum (abbr. $Alq_3$), 9,9'-bianthryl, 9,10-diphenylanthracene (abbr. DPA), 9,10-bis(2-naphthyl) anthracene (abbr. DNA) and the like can be used as well as other substances.

On the other hand, the high molecular weight organic electroluminescent material has higher physical strength and durability of elements than the low molecular weight organic electroluminescent material. In addition, the high molecular weight organic electroluminescent material can be formed by application, therefore, elements can be formed relatively easily. A structure of a light emitting element using the high molecular weight organic electroluminescent material is basically the same as that of the low molecular weight organic electroluminescent material, which is a lamination of a cathode/an organic light emitting layer/an anode in this order. In the case of forming a light emitting layer using the high molecular weight organic electroluminescent material, however, it is difficult to form a lamination structure in such a case of using the low molecular weight organic electroluminescent material, therefore, a two-layer structure is employed in many cases. Specifically, a structure of a lamination of a cathode/a light emitting layer/a hole transporting layer/an anode in this order is employed.

A light emission color is determined by a material which forms a light emitting layer, therefore, by selecting the material, a light emitting element which emits a desired light can be formed. A high molecular weight electroluminescent material which can be used for forming the light emitting layer is, for example, poly-p-phenylenevinylenes, poly-p-phenylenes, polythiophenes, or polyfluorenes.

The poly-p-phenylenevinylenes are, for example, poly(p-phenylenevinylene) [PPV] derivatives such as poly(2,5-dialkoxy-1,4-phenylenevinylene) [RO-PPV], poly(2-(2'-ethyl-hexoxy)-5-methoxy-1,4-phenylenevinylene) [MEH-PPV], and poly(2-(dialkoxyphenyl)-1,4-phenylenevinylene) [ROPh-PPV]. The poly-p-phenylenes are, for example, poly-p-phenylene [PPP] derivative, poly (2,5-dialkoxy-1,4-phenylene) [RO-PPP], and poly (2,5-dihexoxy-1,4-phenylene). The polythiophenes are, for example, polythiophene [PT] derivatives such as poly(3-alkylthiophene) [PAT], poly(3-hexylthiophene) [PHT], poly(3-cyclohexylthiophene) [PCHT], poly(3-cyclohexyl-4-methylthiophene) [PCHMT], poly(3,4-dicyclohexylthiophene) [PDCHT], poly[3-(4-octylphenyl)-thiophene] [POPT], and poly [3-(4-octylphenyl)-2,2-bithiophene] [PTOPT]. Examples of the polyfluorenes include polyfluorene [PF] derivatives such as poly(9,9-dialkylfluorene) [PDAF], and poly(9,9-dioctylfluorene) [PDOF].

By interposing the high molecular weight organic electroluminescent material which has a hole transporting property between an anode and the high molecular weight organic electroluminescent material which emits light, a hole injection property from the anode can be improved. Typically, the high molecular weight organic electroluminescent material dissolved in water with an acceptor material is applied by spin coating and the like. The high molecular weight organic electroluminescent material being insoluble in organic solvent can be laminated with the aforementioned organic electroluminescent material which emits light. Examples of the hole transporting high molecular weight electroluminescent material include a mixture of PEDOT and camphor sulfonic acid (CSA) that is an acceptor material, and a mixture of polyaniline (PANI) and polystyrene sulfonic acid (PSS) that is an acceptor material.

The electroluminescent layer may have a structure for performing a color display by forming electroluminescent layers having different light emission wavebands for each pixel. Typically, light emitting layers corresponding to each color of R (red), G (green), and B (blue) are formed. In this case also, by providing a filter (a colored layer) which transmits light having corresponding light emission waveband to a light emission side of the pixel, a color purity can be improved or a mirrored pixel portion (glare) can be prevented. By providing a filter (a colored layer), a circular polarizer and the like which was required conventionally can be omitted, thus a loss of light emitted from the electroluminescent layer can be eliminated. Moreover, a change in tone which occurs when the pixel portion (a display screen) is seen at a slant can be reduced.

Alternatively, the electroluminescent layer may have a structure that a single color or a white color emission is expressed. In the case of using a white light emitting material, a color display can be performed with a structure provided with a filter (a colored layer) which transmits light having a specific wavelength to a light emission side of the pixel.

In order to form an electroluminescent layer which emits white light, for example, $Alq_3$, $Alq_3$ partially doped with Nile Red as a red light emitting pigment, $Alq_3$, p-EtTAZ, TPD (aromatic diamine) by vapor deposition, a white color emission can be obtained. In the case of forming an EL by an application method using spin coating, it is preferable to perform baking by vacuum heating after the application. For example, poly (ethylene dioxy thiophene)/poly (styrene-sulfonate acid) aqueous solution (PEDOT/PSS) is applied on the whole surface and baked, then polyvinylcarbazole (PVK) solution doped with a luminescence center pigment (1,1,4,4-tetraphenyl-1,3-butadiene (TPB), 4-dicyanomethylene-2-methyl-6-(p-dimethylamino-styryl)-4H-pyran (DCM1), Nile Red, coumarine 6 and the like) is applied on the whole surface and baked.

The electroluminescent layer can be formed in a single layer, or electron transporting 1,3,4-oxadiazole derivative (PBD) may be dispersed to hole transporting polyvinylcarbazole (PVK). Moreover, by dispersing 30 wt % of PBD as an electron transporting agent and dispersing an appropriate amount of 4 kinds of pigments (TPB, coumarine 6, DCM1, and Nile Red), a white light emission can be obtained. By using a material of an electroluminescent layer appropriately other than the light emitting element which exhibits white light emission, a light emitting element which can exhibit red, green, or blue light emission can be manufactured.

By forming a hole transporting high molecular weight organic light emitting material interposed between the anode and a high molecular weight organic light emitting material which emits light, a hole injection property from the anode can be improved. Typically, the high molecular weight organic electroluminescent material dissolved in water with an acceptor material is applied by spin coating and the like. The high molecular weight organic electroluminescent material being insoluble in organic solvent can be laminated with the aforementioned organic electroluminescent material which emits light. Examples of the hole transporting high molecular weight electroluminescent material include a mixture of PEDOT and camphor sulfonic acid (CSA) that is an acceptor material, and a mixture of polyaniline (PANI) and polystyrene sulfonic acid (PSS) that is an acceptor material.

For the electroluminescent layer, a triplet exciton light emitting material containing metal complex and the like may be used other than a singlet exciton light emitting material. Among a pixel which emits a red light, a pixel which emits a green light, and a pixel which emits a blue light, the pixel which emits red light of which luminance decay time is relatively short is formed of the triplet exciton material while the others are formed of the singlet exciton light emitting material. The triplet exciton light emitting material has favorable light emission efficiency, therefore, less power is consumed for obtaining the same luminance. That is, by applying the triplet exciton light emitting material to the pixel which emits a red light, less amount of current is supplied to the light emitting element, thereby the reliability can be improved. For realizing less power consumption, the pixels which emit red and green light may be formed of the triplet exciton light emitting material while the pixel which emits a blue light may be formed of the singlet exciton light emitting material. By forming the light emitting element which emits a green light which has high visibility to human eyes by using the triplet exciton light emitting material, further less power consumption can be realized.

Triplet exciton light emitting material uses a metal complex as a dopant, for example. A metal complex having platinum which is a third transition metal as a center metal, a metal complex having iridium as a center metal and the like are known as a metal complex. The triplet exciton light emitting material is not limited to these compounds but a compound having the aforementioned structure and containing an element from groups 8 to 10 of the Periodic Table of Elements as a center metal can be used as well.

The aforementioned substances which form a light emitting layer are only examples, and a light emitting element can be formed by laminating each functional layer such as a hole injection/transporting layer, a hole transporting layer, an electron injection/transporting layer, an electron transporting layer, a light emitting layer, an electron block layer, and a hole block layer. Moreover, a mixed layer or a mixed junction in which these layers are combined may be formed as well. The structure of the light emitting layer may change, and such changes as providing an electrode functioning for the electron injection region and a light emitting region or dispersing a light emitting material instead of providing the electron injection region and the light emitting region should be construed as being included in the invention unless such changes and modifications depart from the scope of the invention.

The light emitting element formed of the aforementioned material emits light when a forward bias voltage is applied. A pixel of a display device formed by using a light emitting element can be driven by a passive matrix method or an active matrix method. In both methods, each pixel emits light when a forward bias voltage is applied at a certain timing, however, it does not emit light in a certain period. By applying a reverse bias voltage in this non-light emission period, the reliability of the light emitting element can be improved. The light emitting element is deteriorated in such manners that luminance intensity is decreased under a constant driving condition or apparent luminance is decreased due to a non-light emission region increasing in the pixel, however, by performing an alternate current drive that a forward and reverse bias voltage are applied, the progression of the deterioration can be delayed, thus the reliability of the light emitting device can be improved.

A direction that a light emitting element emits light can be divided into following three directions. One is the case where the light emitting element emits light to a substrate side (bottom emission), one is the case where the light emitting element emits light to a counter substrate side which faces the substrate (top emission), and one is the case where the light emitting element emits light to the substrate side and the counter substrate side, that is the case where the light emitting element emits light to one surface and an opposite surface of the substrate (dual emission). In the case of the dual emission, it is an essential requirement that the substrate and the counter substrate transmit light. The light emitted from the light emitting element includes a light emission (fluorescence) which is a light emission when retuning from the single exciton state to the base state and a light emission (phosphorescence) which is a light emission when returning from the triplet exciton state to the base state. The invention can use one or both of the light emissions.

The light emitting element realizes a wide viewing angle, a thin design and lightweight by virtue of not requiring a backlight. In addition, the light emitting element is suitable for displaying a moving image as it features high response speed. By using a display device using such a light emitting element, high-functionality and high added value are realized. This embodiment can be freely combined with the aforementioned embodiment mode.

Embodiment 2

Figure 5A:
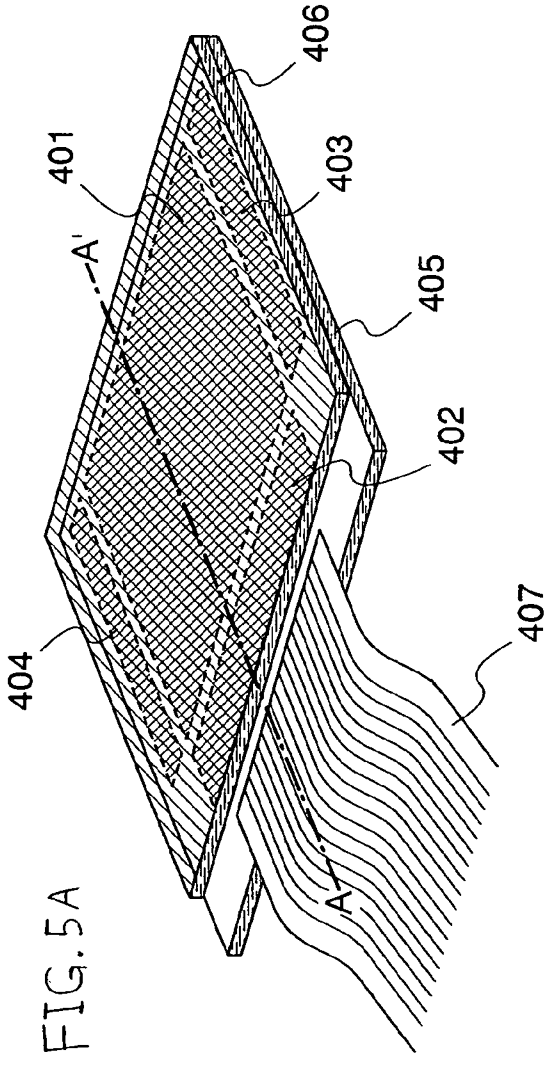
FIGS. 5A and 5B are diagrams showing Embodiment Mode 2 of the invention.

A panel mounted with a display region and a driver circuit, which is one mode of the display device of the invention is described with reference to FIGS. 5A and 5B. A display region 401 including a plurality of pixels each having a light emitting element, a source driver circuit 402, first and second gate driver circuits 403 and 404, a connecting terminal 415 and a connecting film 407 are provided on a substrate 405 (see FIG. 5A). The connecting terminal 415 is connected to the connecting film 407 through anisotropic conductive particles and the like. The connecting film 407 is connected to an IC chip.

Figure 5B:
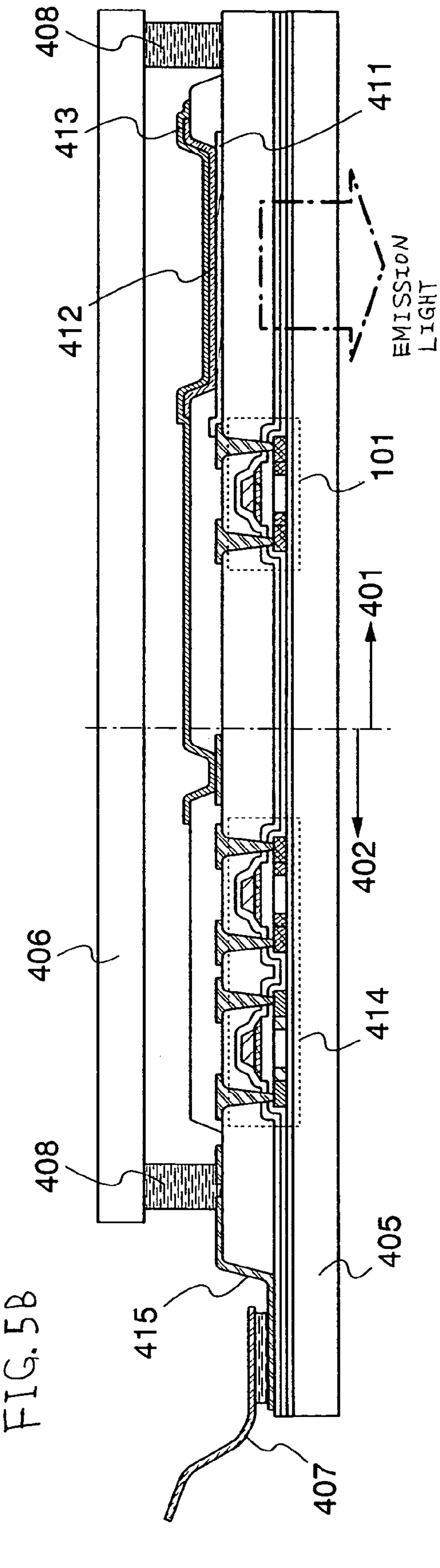

FIG. 5B shows a sectional diagram along A-A' of the panel, including a driving TFT 101 provided in the display region 401 and a CMOS circuit 414 provided in the source driver circuit 402. In addition, a conductive layer 411, an electroluminescent layer 412 and a conductive layer 413 provided in the display region 401 are shown. The conductive layer 411 is connected to a source electrode or a drain electrode of the driving TFT 101. The conductive layer 411 functions as a pixel electrode while the conductive layer 413 functions as a counter electrode. A lamination of the conductive layer 411, the electroluminescent layer 412, and the conductive layer 413 corresponds to a light emitting element.

The light emitting element is sealed with a counter substrate 406 and a sealant 408 provided in the periphery of the display region 401 and the driver circuits 402 to 404. This sealing treatment is performed for protecting the light emitting element from moisture. Here, a method of sealing with a cover material (glass, ceramics, plastic, metal and the like) is used, however, a method of sealing by using heat curable resin or ultraviolet ray curable resin, or a method of sealing by using a thin film which has a high barrier property such as metal oxide and nitride may be employed as well.

It is preferable that the elements formed on the substrate 405 be formed of a crystalline semiconductor (polysilicon) having favorable characteristics such as mobility as compared to an amorphous semiconductor, thereby a monolithic surface can be realized. A panel having the aforementioned structure has less number of external ICs to be connected, thus a compact, light weight, and thin panel can be realized.

In FIG. 5B, the conductive layer 411 is formed of a light-transmitting conductive film and the conductive layer 413 is formed of a reflective film. Therefore, light emitted from the electroluminescent layer 412 transmits the conductive layer 411 and emitted to the substrate 405 side as shown by an arrow. In general, such a structure is referred to as a bottom emission method.

On the other hand, by forming the conductive layer 411 of a reflective film and forming the conductive layer of a light-transmitting conductive film, the light emitted from the electroluminescent layer 412 can be emitted to the counter substrate 406 side. In general, such a structure is referred to as a top emission method.

The source electrode, the drain electrode of the driving TFT 101 and the conductive layer 411 are formed on the same layer without interposing an insulating layer and connected to each other by being overlapped. Therefore, the conductive layer 411 is formed in a region except for a region where the driving TFT 101 and the like are disposed, therefore, an aperture ratio is inevitably reduced in accordance with a high definition of the pixels. Therefore, by additionally providing an interlayer film 416 and a pixel electrode to an independent layer to realize the top emission method, a region where a TFT and the like are formed can efficiently be used as a light emitting region. At this time, the conductive layer 411 and the conductive layer 413 may short-circuited in a contact region of the conductive layer 411 and the source electrode or the drain electrode of the driving TFT 101 depending on a thickness of the electroluminescent layer 412. Therefore, it is preferable to provide a bank 417 to prevent the short-circuit.

By forming the conductive layer 411 and the conductive layer 413 using light-transmitting conductive films as shown in FIG. 8A, light from the electroluminescent layer 412 can be emitted to both directions of the substrate 405 side and the counter substrate 406 side. Such as structure is referred to as a dual emission method.

Figure 8:
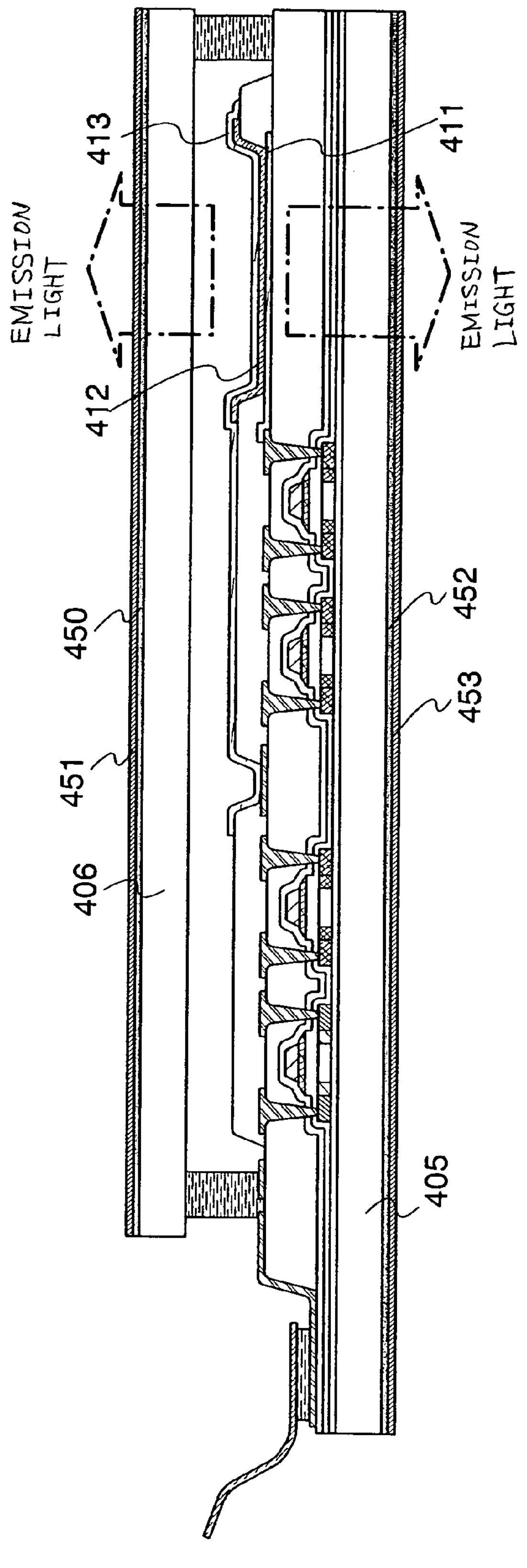
FIG. 8 is a diagram showing Embodiment Mode 2 of the invention.

In the case of FIG. 8, although light emitting areas of the top emission side and the bottom emission side are almost the same, it is needless to say that an aperture ratio of the top emission side can be increased by increasing the area of the pixel electrode by adding an interlayer film as described above.

Figure 6A:
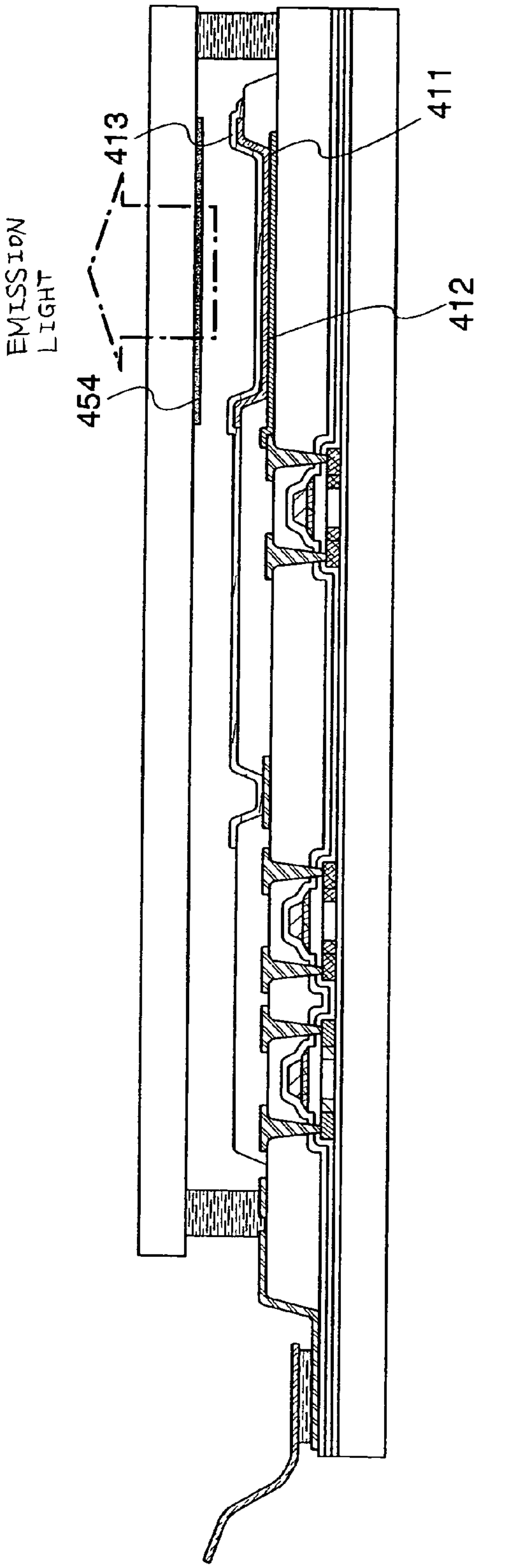
FIGS. 6A and 6B are diagrams showing Embodiment Mode 2 of the invention.
Figure 6B:
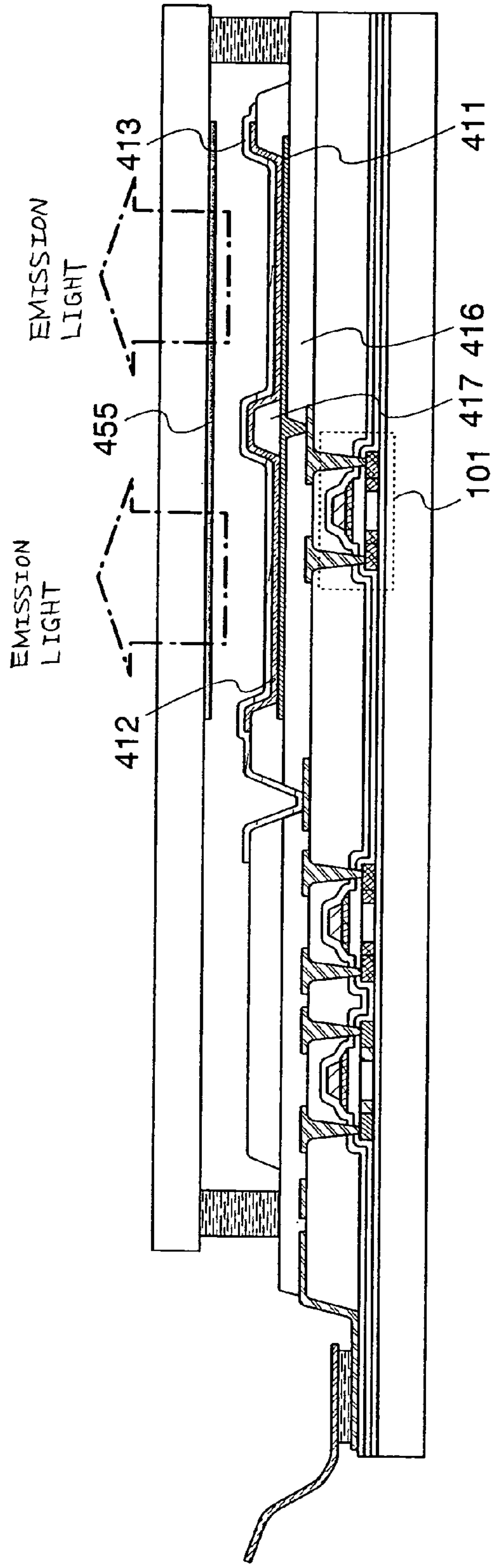

By separately forming the electroluminescent layer 412 included in the light emitting element corresponding to each color of RGB, a full color display can be performed by separating light emitted from the light emitting element into red, green, and blue. By forming the electroluminescent layer 412 corresponding to blue or white without separately forming the electroluminescent layer 412, a color filter or color conversion layers 454 and 455 may be provided (see FIGS. 6A and 6B).

In the case of employing the dual emission method shown in FIG. 8, it is preferable to provide polarizers 450 and 452 on both of the substrate 405 and the counter substrate 406. In this manner, with the polarizers 450 and 452 being adhered, a panel itself does not transmit light, therefore, surrounding scenery is not seen therethrough. The polarizers 450 and 452, being disposed so that their polarizing directions cross each other, can shield external light. The cross angle is from 40° to 90°, preferably 70° to 90°, or more preferably 90°. According to the aforementioned structure, a region except for a region for performing display performs black display, the surrounding scenery is not seen through when seen from either side. That is, by disposing the polarizers 450 and 452 appropriately, external light does not transmit the dual display panel but only the light emitted from the light emitting element transmits, therefore, a contrast is improved. By additionally providing a measure that one or both of the polarizer 450 and 452 can be rotatable to change the cross angle, the transmissivity of the panel itself can be changed. That is, light adjusting function can be additionally provided as well. By providing antireflection films or antireflection films 451 and 453, a reflectivity can be reduced to improve the display quality. In addition, a ½ or ¼ wavelength plate (or the film) may be provided. By providing an optical functional film, the display quality is improved, in particular favorable density of black color can be obtained.

Note that the invention is not limited to the aforementioned embodiment. For example, the display region 401 may be formed of TFTs of which channel portion is formed of an amorphous semiconductor (amorphous silicon) formed on an insulating surface and the driver circuits 402 to 404 may be formed of an IC chip. The IC chip may be adhered on the substrate by a COG method or adhered on a connecting film which is connected to the substrate. The amorphous semiconductor can be formed into a large substrate by using a CVD method, thus an inexpensive panel can be provided by virtue of not requiring a step of crystallization. In this case, by forming a conductive layer by a droplet discharging method represented by an ink-jetting method, a more inexpensive panel can be provided. This embodiment can be freely implemented in combination with the aforementioned embodiment mode and embodiment.

Embodiment 3

Examples of electronic apparatuses provided with a display region including a light emitting element are, a television apparatus, a digital camera, a digital video camera, a portable telephone apparatus (a portable phone), a portable information terminal such as a PDA, a portable game machine, a monitor, a notebook personal computer, an audio reproducing apparatus such as a car audio set, an image reproducing apparatus provided with a recording medium such as a home game machine. Specific examples of these are described hereafter.

FIG. 7A illustrates a portable information terminal including a main body 9201, a display portion 9202 and the like. FIG. 7B illustrates a digital video camera including a display portion 9701, a main body 9702 and the like. FIG. 7C illustrates a portable terminal including a main body 9101, a display portion 9102 and the like. FIG. 7D illustrates a portable television apparatus including a main body 9301, a display portion 9302 and the like. FIG. 7E illustrates a portable computer including a main body 2202, a display portion 2203 and the like. FIG. 7F illustrates a television apparatus including a main body 2001, a display portion 2003 and the like. The invention is applied to a structure of a display device including a display portion. By applying the invention, a display screen that a high image quality and high reliability are realized can be provided, thus an electronic apparatus that high functionality and high added value are realized can be provided. This embodiment can be freely implemented in combination with the aforementioned embodiment mode and embodiment modes.

This application is based on Japanese Patent Application serial no. 2004-017569 filed in Japan Patent Office on Jan. 26, 2004, the contents of which are hereby incorporated by reference.

What is claimed is:

1. A display device comprising:

a plurality of pixels arranged in matrix, wherein the plurality of pixels each comprises a light emitting element, a first transistor, a second transistor, a third transistor, a fourth transistor, a capacitor, and an alternate current driving bypass element;

wherein a gate terminal of the third transistor is connected to a third wiring, one of a source terminal and a drain terminal of the third transistor is connected to a first wiring and the other is connected to a gate terminal of the second transistor;

wherein one of a source terminal and a drain terminal of the second transistor is connected to a second wiring and the other is connected to the gate terminal of the second transistor;

wherein a gate terminal of the fourth transistor is connected to a fourth wiring, one of a source terminal and a drain terminal of the fourth transistor is connected to a gate terminal of the second transistor and the other is connected to a gate terminal of the first transistor;

wherein one of a source terminal and a drain terminal of the first transistor is connected to the second wiring and the other is connected to a first electrode of a light emitting element;

wherein a second electrode of the light emitting element is connected to a counter power source;

wherein one of terminals of the capacitor is connected to the second wiring and the other is connected to the gate terminal of the first transistor; and wherein one of terminals of the alternate current driving bypass element is connected to the second wiring and the other is connected to the first electrode of the light emitting element.

2. A device according to claim 1, wherein the alternate current driving bypass element is a diode.

3. A device according to claim 1, wherein the alternate current driving bypass element is a transistor of which gate terminal and a drain terminal are connected.

4. A device according to claim 1, wherein one of the first electrode and the second electrode of the light emitting element transmits light and the other reflects light.

5. A device according to claim 1, wherein the first electrode and the second electrode of the light emitting element transmit light.

6. A display device comprising:

a plurality of pixels arranged in matrix, wherein the plurality of pixels each comprises a light emitting element, a first transistor, a second transistor, a third transistor, a fourth transistor, a capacitor, and an alternate current driving bypass element;

wherein a gate terminal of the third transistor is connected to a third wiring, one of a source terminal and a drain terminal of the third transistor is connected to a first wiring and the other is connected to one of a source terminal and a drain terminal of the second transistor;

the other of the source terminal and the drain terminal of the second transistor is connected to a second wiring;

wherein a gate terminal of the fourth transistor is connected to a fourth wiring, one of a source terminal and a drain terminal of the fourth transistor is connected to a connection of one of the source terminal and the drain terminal of the second transistor and one of the source terminal and the drain terminal of the third transistor and a gate terminal of the second transistor, and the other is connected to a gate terminal of the first transistor;

wherein one of a source terminal and a drain terminal of the first transistor is connected to the second wiring and the other is connected to a first electrode of a light emitting element;

wherein a second electrode of the light emitting element is connected to a counter power source;

wherein one of terminals of the capacitor is connected to the second wiring and the other is connected to the gate terminal of the first transistor; and wherein one of terminals of the alternate current driving bypass element is connected to the second wiring and the other is connected to a first electrode of the light emitting element.

7. A device according to claim 6, wherein the alternate current driving bypass element is a diode.

8. A device according to claim 6, wherein the alternate current driving bypass element is a transistor of which gate terminal and a drain terminal are connected.

9. A device according to claim 6, wherein one of the first electrode and the second electrode of the light emitting element transmits light and the other reflects light.

10. A device according to claim 6, wherein the first electrode and the second electrode of the light emitting element transmit light.

* * * * *